(12) United States Patent
Tanaka et al.

(10) Patent No.: US 8,736,053 B2
(45) Date of Patent: May 27, 2014

(54) SEMICONDUCTOR DEVICE (75) Inventors: Koichi Tanaka, Nagano (JP); Nobuyuki Kurashima, Nagano (JP); Hajime Iizuka, Nagano (JP); Tetsuya Koyama, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 0 days.

(21) Appl. No.: 13/526,821

(22) Filed: Jun. 19, 2012

(65) Prior Publication Data

US 2012/0319274 A1 Dec. 20, 2012

(30) Foreign Application Priority Data

Jun. 20, 2011 (JP) ................................. 2011-136474

(51) Int. Cl.
*H01L 23/48* (2006.01)

(52) U.S. Cl.
USPC ..... 257/738; 257/744; 257/778; 257/E21.502

(58) Field of Classification Search
CPC .................... H01L 2224/81; H01L 2225/1058
USPC ......... 257/673, 676, 686, 733, 744, 737–738; 438/107–109, 121–122, 125, 127
See application file for complete search history.

(56) References Cited

U.S. PATENT DOCUMENTS 7,777,351 B1 8/2010 Berry et al.
2011/0024904 A1* 2/2011 Egawa .......................... 257/738

* cited by examiner

*Primary Examiner* — Dung A. Le
(74) *Attorney, Agent, or Firm* — Drinker Biddle & Reath LLP (57) ABSTRACT

A circuit substrate having a mounting surface on which a semiconductor chip is mounted and at least one connection pad formed on the mounting surface is connected to a support plate having at least one mounting portion with a diameter larger than a diameter of the connection pad, through a truncated-cone-shaped solder layer which is formed from at least one solder ball on the basis of a difference between the diameter of the mounting portion and the diameter of the connection pad.

10 Claims, 6 Drawing Sheets

SEMICONDUCTOR DEVICE

CROSS-REFERENCE TO RELATED APPLICATION(S)

The present application claims the benefit of priority of Japanese Patent Application No. 2011-136474, filed on Jun. 20, 2011. The disclosures of the application are incorporated herein by reference.

BACKGROUND

Technical Field

The present disclosure relates to a method of manufacturing a semiconductor device, and a semiconductor device.

There has been known a package wherein a semiconductor chip is flip-chip connected on a substrate (Flip Chip-Ball Grid Array). The package of this type has been used in the aspect of a so-called "POP" (Package On Package) wherein at least two semiconductor packages are stacked on each other, with the progress of functions in various electronic equipments such as a digital camera and a portable telephone, especially the functions of image processing.

The package stated above has the problem that its warp enlarges with the lapse of time. For decreasing such a warp, it is performed, for example, to increase the thickness of the substrate, to mold the semiconductor chip with a resin, or to further mold the whole package with a resin.

For the purpose of realizing the POP implementation by the use of the packages molded with the resin as stated above, connection pads for connecting the individual packages to one another need to be formed after the step of the resin molding.

As a method wherein the packages molded with the resin are formed with the connection pads, there is a method in which, using a laser beam, vias are formed in molding resin layers.

U.S. Pat. No. 7,777,351, for example, discloses a semiconductor package wherein a solder ball is supplied to an upper-side connection terminal formed on a lower-side circuit substrate, and a molding resin layer of an insulating material is formed on the upper surface of the lower-side circuit substrate. On the upper side of the solder ball in the semiconductor package, a conical via is formed so that the upper surface of the solder ball may be exposed above.

The via through which the upper surface of the solder ball is exposed above is formed in such a way that the molding resin layer is subjected to a hole-forming process based on the laser beam.

In addition, in order to achieve a POP structure by connecting the semiconductor package with a upper-side circuit substrate, a solder ball formed on the lower surface of the upper-side circuit substrate is arranged within the via of the semiconductor package, and a solder reflow process is performed, thereby to connect the semiconductor package and the upper-side circuit substrate.

PRIOR-ART DOCUMENT

Patent Document

[Patent Document 1] U.S. Pat. No. 7,777,351

However, in the case where the solder ball is exposed from the via by the use of the hole-forming process based on the laser beam, there are such problems that a long working period of time is required because the molding resin layer is thick, and that the laser work is difficult. Besides, since each via formed by the laser work has a conical and tapered shape whose diameter is enlarged on the upper side and the vias adjacent to each other interfere with each other, it is difficult to narrow the pitch between the solder balls, on the upper surface of the circuit substrate.

Further, the via is formed by the laser work such as the laser hole-forming process. In the case where the via is formed by removing the molding resin layer with the laser work, it is very difficult to completely remove a resin component which becomes smear, from the surface of the solder ball.

On account of the difficulty, the coating of the resin component remains on the surface of the solder ball. As a result, even when the solder reflow process is performed, it is difficult to reliably connect the solder ball within the via and the solder ball formed on the lower surface of the upper-side circuit substrate. Thus, the electrical connection reliability between the semiconductor package substrates may lower drastically.

SUMMARY

One or more exemplary embodiments of the present invention provide a method of manufacturing a semiconductor device, and a semiconductor device which can have a high connection reliability without generating smear or the like, which can easily narrow the pitch between solder balls, and which can realize a POP structure at a low cost.

A method of manufacturing a semiconductor device according to an exemplary embodiment, comprises:
  preparing a support plate having at least one mounting portion;
  preparing a circuit substrate having a mounting surface on which a semiconductor chip is mounted and at least one connection pad formed on the mounting surface, the connection pad having a second diameter smaller than a first diameter of the mounting portion;
  arranging the circuit substrate with the support plate through at least one solder ball so that the mounting surface of the circuit substrate faces a surface of the support plate on which the mounting portion is formed;
  connecting the mounting portion of the support plate and the connection pad of the circuit substrate through a truncated-cone-shaped solder layer which is formed from the solder ball on the basis of a difference between the first diameter of the mounting portion and the second diameter of the connection pad;
  forming a resin layer between the support plate and the mounting surface of the circuit substrate and removing the support plate, whereby at least one truncated-cone-shaped via is formed in the resin layer along the truncated-cone-shaped solder layer; and
  performing a reflow process, whereby the truncated-cone-shaped solder layer is formed into a spherical solder layer within the via and a part of the spherical solder layer is exposed from the resin layer through the via.

The support plate may be prepared by forming the mounting portion of a protruding shape in the support plate. The support plate may be a substrate and the mounting portion may be a mounting pad formed on the substrate.

Before arranging the circuit substrate with the support plate, the solder ball may be mounted on the mounting portion. Before arranging the circuit substrate with the support plate, the solder ball may be mounted on the connection pad.

The solder ball may have a spherical copper core and the solder layer formed on a surface of the spherical copper core. The solder ball may have a spherical lead-free solder core and the solder layer having a low-melting property formed on a surface of the spherical lead-free solder core.

The support plate may be removed through an etching process. The support plate may be removed through a polishing process.

A semiconductor device according to an exemplary embodiment, comprises:

a semiconductor chip;

a circuit substrate having a mounting surface on which the semiconductor chip is mounted and at least one connection pad formed on the mounting surface;

a resin layer formed on the mounting surface of the circuit substrate, the resin layer having at least one truncated-cone-shaped via; and at least one mounting terminal disposed on the connection pad and connected to the connection pad, the mounting terminal having a spherical solder layer, a part of the spherical solder layer exposed through the truncated-cone-shaped via of the resin layer, wherein the mounting terminal is formed in such a way that the circuit substrate is connected to a support plate having at least one mounting portion with a diameter larger than a diameter of the connection pad, through a truncated-cone-shaped solder layer which is formed from at least one solder ball on the basis of a difference between the diameter of the mounting portion and the diameter of the connection pad, that the resin layer is formed between the mounting surface of the circuit substrate and the support plate and the support plate is subsequently removed, whereby the truncated-cone-shaped via is formed in the resin layer along the truncated-cone-shaped solder layer, and that a reflow process is thereafter performed, whereby the truncated-cone-shaped solder layer is formed into the spherical solder layer within the truncated-cone-shaped via.

The mounting portion of the support plate may have a protruding shape. The support plate may be a substrate and the mounting portion may be a mounting pad formed on the substrate.

Before connecting the circuit substrate to the support plate, the solder ball may be mounted on the mounting portion. Before connecting the circuit substrate to the support plate, the solder ball may be mounted on the connection pad.

The solder ball may have a spherical copper core and the solder layer formed on a surface of the spherical copper core. The solder ball may have a spherical lead-free solder core and the solder layer having a low-melting property formed on a surface of the spherical lead-free solder core.

The support plate may be removed through an etching process. The support plate may be removed through a polishing process.

In a method of manufacturing a semiconductor device, and a semiconductor device according to the exemplary embodiment of the present invention, a mounting terminal of the semiconductor device is formed in the following way: a solder ball is mounted on a protruding mounting portion formed in a support plate, each having a diameter larger than a diameter of a connection pad; the solder ball and the corresponding connection pad are connected through a truncated-cone-shaped solder layer, which is formed from the solder ball on the basis of the difference between the diameter of the mounting portion and the diameter of the connection pad; a resin layer is formed between the mounting surface of a circuit substrate and the support plate and the support plate is subsequently removed, whereby a truncated-cone-shaped via is formed in the resin layer along the truncated-cone-shaped solder layer; and a reflow process is thereafter performed, whereby the truncated-cone-shaped solder layer is formed into a spherical solder layer within the via, and a part of the spherical solder layer is exposed through the via.

On this occasion, the via formed in the resin layer is formed in the shape of the truncated cone along the truncated-cone-shaped solder layer formed from the solder ball on the basis of the difference between the diameter of the mounting portion and the diameter of the connection pad, at the point of time of the removal of the support plate. Such a via can be formed at a lower cost as compared with a via formed by a laser work, because a laser or the like installation is unnecessary.

Moreover, as stated above, the via is formed without resorting to a laser work. Therefore, quite no resin component to become smear remains on the surface of the spherical solder layer which serves as the mounting terminal. Accordingly, in realizing a POP structure, semiconductor package substrates can be connected to each other with a high connection reliability.

Furthermore, the shape and size of the truncated-cone-shaped solder layer formed from the solder ball can be precisely designed by adjusting the difference between the diameter of the solder-ball-mounting portion of the support plate and that of the connection pad on the circuit substrate and a solder quantity in the solder ball which is mounted on the solder-ball-mounting portion. Therefore, also the shape and size of the via which is formed along such a truncated-cone-shaped solder layer can be precisely designed. Accordingly, the narrowing of the pitch between the mounting terminals can be flexibly coped with by freely setting the pitch between the vias on the circuit substrate.

BRIEF DESCRIPTION OF THE DRAWINGS

The above and other aspects of the present invention will become more apparent from the following description of exemplary embodiments, taken in conjunction with the accompanying drawings of which.

DETAILED DESCRIPTION

Now, a semiconductor device according to a first embodiment of the present invention will be described in conjunction with FIG. 1.

Figure 1:
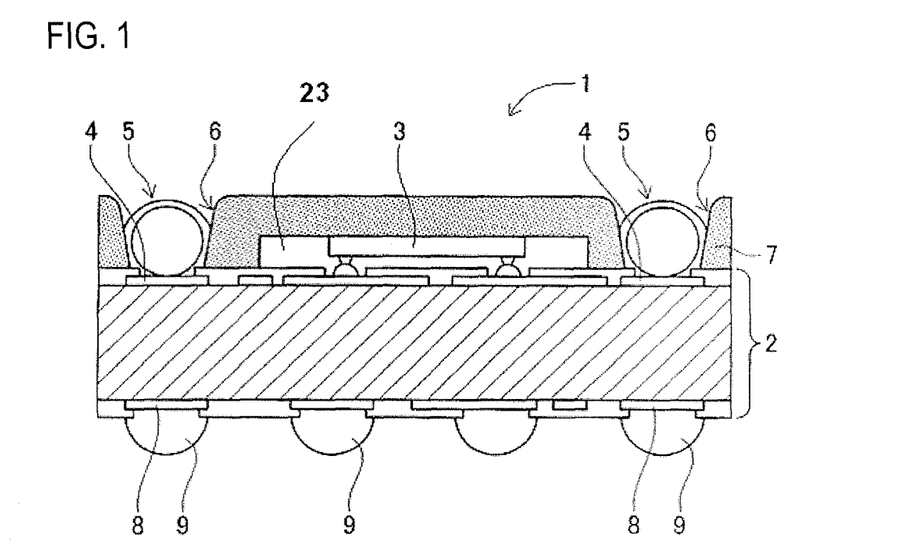
FIG. 1 is a sectional view showing a semiconductor device according a first embodiment.

Referring to FIG. 1, the semiconductor device 1 according to the first embodiment includes a circuit substrate 2. A semiconductor chip 3 is mounted on the upper surface (mounting surface) of the circuit substrate 2. One connection pad 4 is formed on each of both the sides of the semiconductor chip 3. Solder balls 5 are mounted on the respective connection pads 4. The gap between the semiconductor chip 3 and the circuit substrate 2 is filled with an underfill resin 23.

Each solder ball 5 includes a spherical copper core 5A and a solder layer 5B formed on the surface of the spherical copper core 5A. The diameter of the copper core 5A is 50 µm to 200 µm or so, and the whole diameter of the solder ball including the solder layer 5B is 80 µm to 300 µm.

The upper surface of the circuit substrate 2 is formed with molding resin layer 7 which covers the semiconductor chip 3, and which have vias 6 so as to expose the upper end parts of the corresponding solder balls 5. The lower surface of the circuit substrate 2 is formed with a plurality of connection terminals 8. Solder balls 9 are mounted on the respective connection terminals 8.

Next, a method of manufacturing the semiconductor device 1 will be described in conjunction with FIGS. 2A to 2D.

First, solder-ball mounting portions 11 of a protruding shape, for mounting the solder balls 5 thereon, are formed on a support plate 10 made of copper, and the solder balls 5 are thereafter mounted on the solder-ball mounting portions 11. A method of manufacturing the support plate 10 will be described in detail in conjunction with FIGS. 3A to 3E.

Figure 3A:
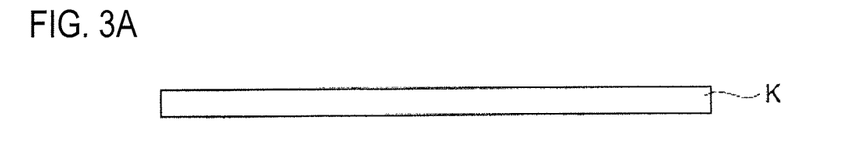
FIGS. 3A to 3E are views showing a method of forming solder-ball mounting portions in a support plate.
Figure 3B:
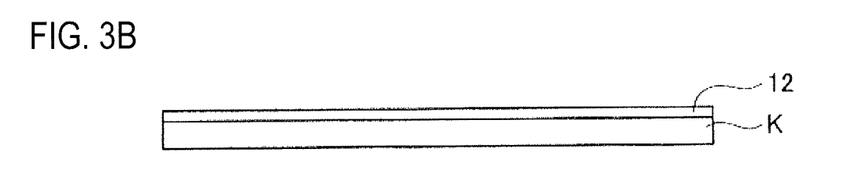
Figure 3C:
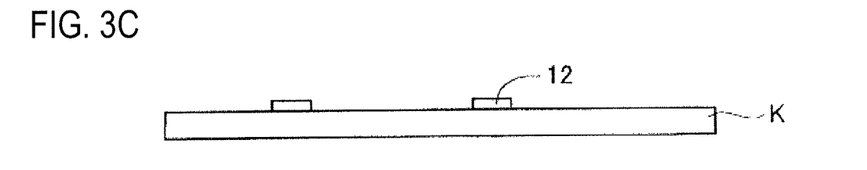

In order to form the support plate 10 having the solder-ball mounting portions 11, first of all, a thin plate K made of copper shown in FIG. 3A is prepared, and a photoresist film 12 is formed by coating the whole surface of one side of the thin plate K with a photoresist, as shown in FIG. 3B. Thereafter, the photoresist film 12 is covered with a mask which is opened at parts except parts corresponding to the solder-ball mounting portions 11, and it is exposed to light and developed in conventional fashion so that the photoresist film 12 may remain at only the parts corresponding to the solder-ball mounting portions 11. Thus, as shown in FIG. 3C, only the parts corresponding to the solder-ball mounting portions 11 are covered with the photoresist film 12, and the photoresist film 12 is removed from the other parts.

Thereafter, the thin plate K is immersed in a copper etching solution, thereby to perform so-called "half-etching". Thus, those parts of the thin plate K which are not covered with the photoresist film 12 (the parts which do not correspond to the solder-ball mounting portions 11) are etched and are thinned. In this state, the thickness of the parts which correspond to the solder-ball mounting portions 11 and at which the photoresist film 12 exists is kept as it is. Therefore, when the resist film 12 is thereafter removed, the support plate 10 having the solder-ball mounting portions 11 is formed from the thin plate K as shown in FIG. 3D.

Figure 3D:
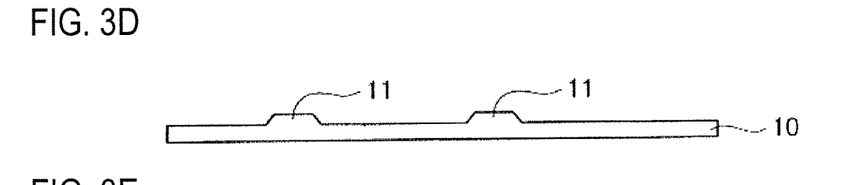

Each of the solder-ball mounting portions 11 should preferably be brought into the shape of a truncated cone narrowing toward a surface on which the solder ball is to be mounted, as shown in FIG. 3D.

Here, the pad of each solder-ball mounting portion 11 is formed having a diameter in a range of 210 µm to 400 µm.

Figure 3E:
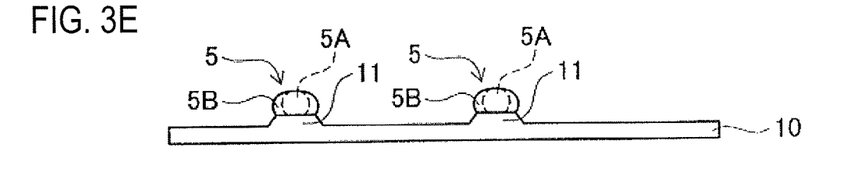

After the support plate 10 has been formed with the solder-ball mounting portions 11 as stated above, the solder balls 5 are mounted on the respective solder-ball mounting portions 11 and connected to the respective solder-ball mounting portions 11 by heating (FIG. 3E).

Figure 2A:
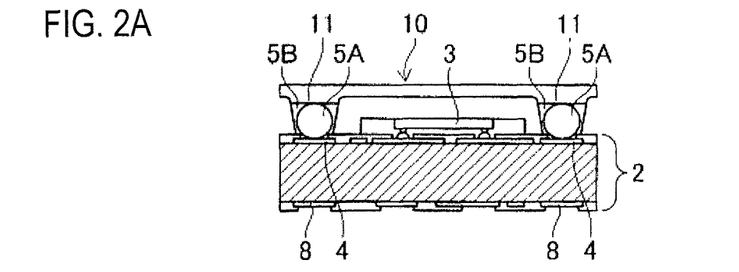
FIGS. 2A to 2D are views showing a method of manufacturing the semiconductor device according to the first embodiment.

Referring back to FIGS. 2A to 2D, the respective solder balls 5 of the support plate 10 are opposed to and abutted with the corresponding connection pads 4 of the circuit substrate 2 on which the semiconductor chip 3 is mounted. More specifically, the support plate 10 is attached to a head (not shown) having a built-in heater and the circuit substrate 2 is attached to a stage (not shown) having a built-in heater. The head is opposed to the stage so that the respective solder balls 5 are opposed to and abutted with the corresponding connection pads 4. In this state, the support plate 10 and the circuit substrate 2 are heated by the built-in heaters, respectively, and thus, as shown in FIG. 2A, the respective solder balls 5 of the support plate 10 are connected to the corresponding connection pads 4 of the circuit substrate 2.

As the solder ball 5, there is used one in which the solder layer 5B is formed on the surface of the spherical copper core 5A, so that the gap between the support plate 10 and the circuit substrate 2 can be precisely and reliably held through the copper core 5A.

Here, the diameter of each connection pad 4 formed on the circuit substrate 2 is in a range of 50 µm to 200 µm, and it is smaller than the diameter (120 µm to 400 µm) of the solder-ball mounting portion 11 of the support plate 10.

As stated above, a difference is provided between the diameter of the solder-ball mounting portion 11 of the support plate 10 and the diameter of the connection pad 4 of the circuit substrate 2. Owing to such a difference of the diameters, when the solder ball 5 of the support plate 10 is connected to the connection pad 4 of the circuit substrate 2 by heating with the heaters, the solder layer 5B formed on the surface of the solder ball 5 is formed into a solder layer in the shape of a downward truncated cone, as shown in FIG. 2A. In other words, the shape of the solder layer 5B is changed to the shape of the downward truncated cone. Thus, the solder ball 5 of the support plate 10 and the connection pad 4 on the circuit substrate 2 are connected through the solder layer 5B in the shape of the truncated cone whose diameter is reduced downwards and enlarged upwards.

Figure 2B:
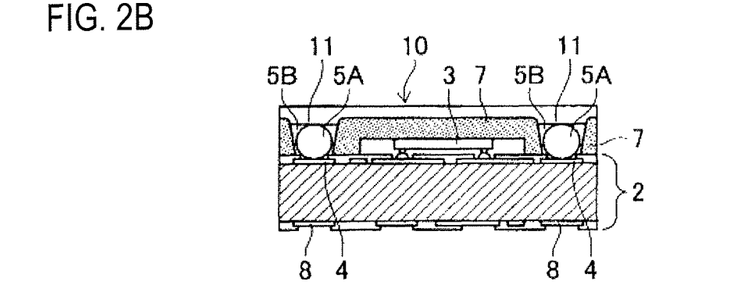

Subsequently, as shown in FIG. 2B, an epoxy-based resin is filled between the mounting surface of the circuit substrate 2 and the support plate 10 by a so-called "transfer molding process", thereby to form the molding resin layer 7.

Figure 2C:
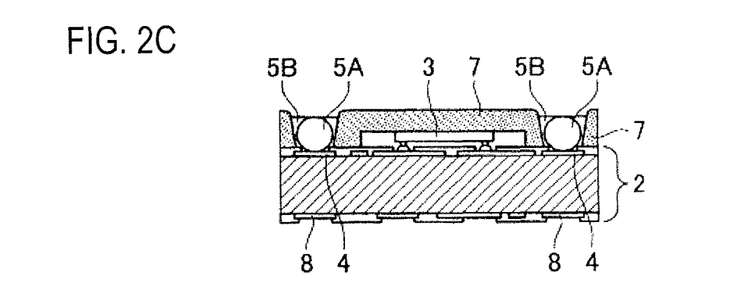

Thereafter, an etching is performed with, for example, an alkali etching solution (produced by Meltex Inc., trade name: "A PROCESS"), thereby to selectively remove only the support plate 10 (FIG. 2C).

In this state, the molding resin layer 7 is formed with the vias 6 each being in the shape of a truncated cone, along the truncated-cone-shaped solder layers 5B.

Figure 2D:
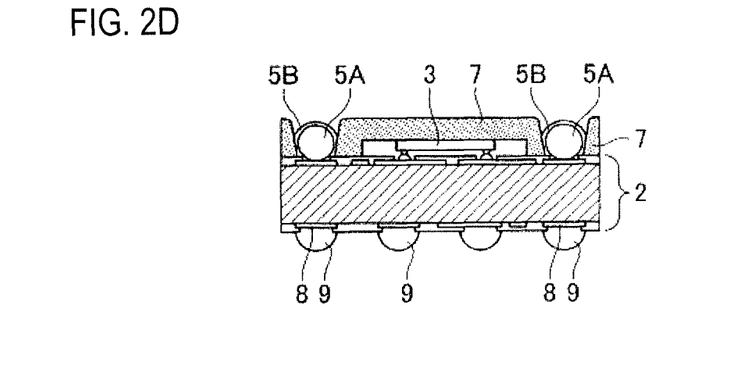

Further, a reflow process is performed, whereby the solder balls 9 are mounted on the respective connection terminals 8 formed on the lower surface of the circuit substrate 2 (FIG. 2D).

On this occasion, the truncated-cone-shaped solder layer 5B stated above is formed into a spherical solder layer along the surface of the copper core 5A on the basis of the surface tension of the solder layer 5B, and part of the spherical solder layer 5B is exposed from the molding resin layer 7 through the via 6.

Thus, the semiconductor device 1 is manufactured. In the semiconductor device 1, that upper end part of the solder layer 5B which is exposed from each via 6 of the molding resin layer 7 serves as a mounting terminal for connecting this semiconductor device with another circuit substrate or the like.

Figure 4A:
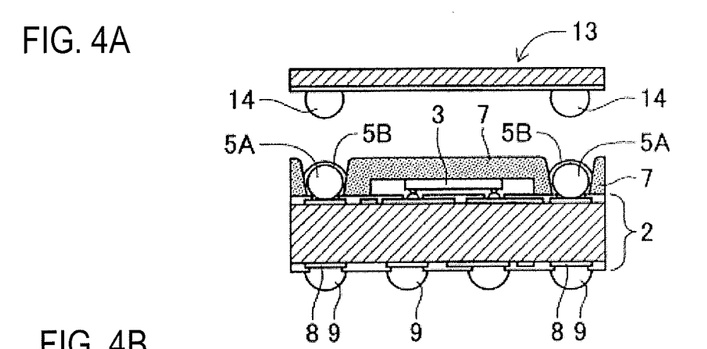
FIGS. 4A to 4C are views showing a method of manufacturing a POP structure by stacking another circuit substrate on the semiconductor device according to the first embodiment.
Figure 4B:
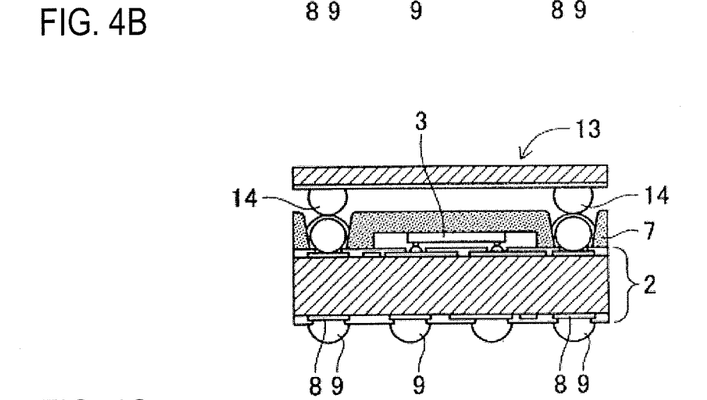
Figure 4C:
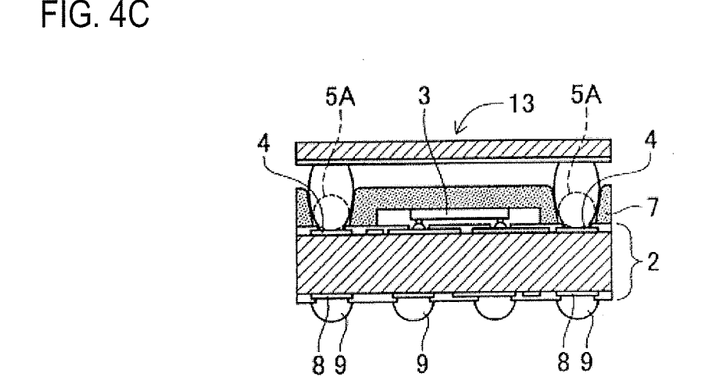

Another package substrate 13 is stacked on the semiconductor device 1 manufactured as stated above, as shown in FIGS. 4A to 4C, whereby a POP structure is formed.

Here, a method of stacking the other package substrate 13 on the semiconductor device 1 will be described in conjunction with FIGS. 4A to 4C.

Referring to FIGS. 4A to 4C, solder balls 14 are mounted on respective connection terminals which are formed at the lower surface of the package substrate 13. First, the respective solder balls 14 of the package substrate 13 and the upper end parts of the solder balls 5 (solder layers 5B) exposed from the corresponding vias 6 in the semiconductor device 1 are arranged to be opposed to each other as shown in FIG. 4A. Further, as shown in FIG. 4B, the respective solder balls 14 of the package substrate 13 are arranged in the individual vias 6 to which the corresponding solder balls 5 are exposed, whereby the package substrate 13 is stacked on the semiconductor device 1.

A reflow process is performed in a state where the package substrate 13 is stacked on the semiconductor device 1 as stated above. Thus, the respective solder balls 14 of the package substrate 13 and the corresponding solder balls 5 of the semiconductor device 1 are fusion-connected to each other. This state is shown in FIG. 4C.

Here, the molding resin layer 7 in the semiconductor device 1 is formed with the downward truncated-cone-shaped vias 6 so that parts of the corresponding solder balls 5 (solder layers 5B) may be exposed. Therefore, in stacking the package substrate 13 on the semiconductor device 1, the respective solder balls 14 of the package substrate 13 are permitted to be simply arranged in the corresponding vias 6. As a result, the mounting of the package substrate 13 on the semiconductor device 1 can be done easily and reliably.

In the semiconductor device 1 and the manufacturing method thereof according to the first embodiment, the mounting terminals (solder balls 5) of the semiconductor device 1 are formed in such a way that the solder balls 5 are respectively mounted on the solder-ball-mounting portions 11 of the support plate 10 each having the diameter larger than the diameter of the connection pad 4, that the solder balls 5 and the corresponding connection pads 4 are connected to each other through the truncated-cone-shaped solder layers 5B formed from the solder balls 5 on the basis of the difference between the diameter of the solder-ball-mounting portion 11 and the diameter of the connection pad 4, that the molding resin layer 7 is formed between the mounting surface of the circuit substrate 2 and the support plate 10 and the support plate 10 is subsequently removed, whereby the truncated-cone-shaped vias 6 are formed in the molding resin layer 7 along the truncated-cone-shaped solder layers 5B, and that the reflow process is thereafter performed, whereby the truncated-cone-shaped solder layers 5B are formed into the spherical solder layers 5B within the vias 6, and parts of the spherical solder layers 5B are exposed through the vias 6.

On this occasion, each of the vias 6 formed in the molding resin layer 7 is formed in the shape of the truncated cone along the truncated-cone-shaped solder layer 5B formed from the solder ball 5 on the basis of the difference between the diameter of the solder-ball-mounting portion 11 and the diameter of the connection pad 4, at the point of time of the removal of the support plate 10. Such a via 6 can be formed at a lower cost as compared with a via formed by a laser work, because a laser or the like installation is unnecessary.

Moreover, as stated above, the via 6 is formed without the laser work. Therefore, quite no resin component to become smear remains on the surface of the spherical solder layer 5B which serves as the mounting terminal (solder ball 5). Accordingly, in realizing a POP structure, semiconductor package substrates can be connected to each other with a high connection reliability.

Furthermore, the shape and size of the truncated-cone-shaped solder layer 5B formed from the solder ball 5 can be precisely designed by adjusting the difference between the diameter of the solder-ball-mounting portion 11 of the support plate 10 and the diameter of the connection pad 4 of the circuit substrate 2 and the solder quantity of the solder layer 5B in the solder ball 5 which is mounted on the solder-ball-mounting portion 11. Therefore, also the shape and size of the via 6 which is formed along such a truncated-cone-shaped solder layer 5B can be precisely designed. Accordingly, the narrowing of the pitch between the mounting terminals can be flexibly coped with by freely setting the pitch between the vias 6 on the circuit substrate 2.

By the way, in the first embodiment, there has been used the support plate 10 which is formed with the solder-ball-mounting portions 11 by performing the etching of the thin plate K. However, this support plate is not limited, but any thin plate of a metal, for example, Ni (nickel) as is selectively removable with an etching solution so as to leave solder-ball-mounting portions behind can be used as a support plate.

Next, a method of manufacturing a semiconductor device according to a second embodiment will be described in conjunction with FIGS. 5A to 5D.

Here, in the method of manufacturing the semiconductor device as shown in FIGS. 5A to 5D, an upper substrate 20 on which the solder balls 5 are mounted is used instead of the support plate 10 which is used in the manufacturing method of the first embodiment.

Figure 5A:
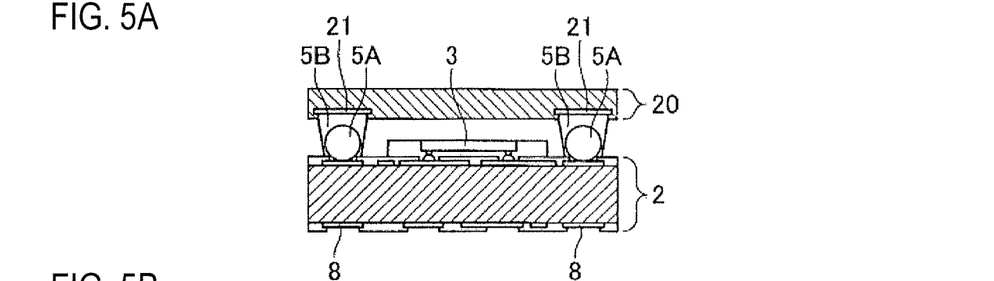
FIGS. 5A to 5D are views showing a method of manufacturing a semiconductor device according to a second embodiment.

The upper substrate 20 is formed with solder-ball-mounting pads 21, and each of such solder-ball-mounting pads 21 has a diameter of 120 μm to 400 μm. The solder balls 5 are mounted on the respective solder-ball-mounting pads 21 and connected to the respective solder-ball-mounting pads 21 by heating.

First, as shown in FIG. 5A, the solder balls 5 mounted on the solder-ball-mounting pads 21 of the upper substrate 20 are respectively opposed to and abutted with the corresponding connection pads 4 of the circuit substrate 2 on which the semiconductor chip 3 is mounted. More specifically, the upper substrate 20 is attached to a head (not shown) having a built-in heater and the circuit substrate 2 is attached to a stage (not shown) having a built-in heater. The head is opposed to the stage so that the respective solder balls 5 are opposed to and abutted with the corresponding connection pads 4. In this state, the upper substrate 20 and the circuit substrate 2 are heated by the built-in heaters, respectively, and thus, as shown in FIG. 5A, the respective solder balls 5 of the upper substrate 20 are connected to the corresponding connection pads 4 of the circuit substrate 2.

As the solder ball 5, there is used one in which the solder layer 5B is formed on the surface of the spherical copper core 5A, so that the gap between the upper substrate 20 and the circuit substrate 2 can be precisely and reliably held through the copper core 5A.

Here, as in the case of the first embodiment, the diameter of each connection pad 4 formed on the circuit substrate 2 is in the range of 50 μm to 200 μm, and it is smaller than the diameter of the solder-ball-mounting pad 21 of the upper substrate 20.

As stated above, a difference is provided between the diameter of the solder-ball mounting portion 21 of the upper substrate 20 and the diameter of the connection pad 4 of the circuit substrate 2. Owing to such a difference of the diameters, when the solder ball 5 of the upper substrate 20 is connected to the connection pad 4 of the circuit substrate 2 by heating with the heaters, the solder layer 5B formed on the surface of the solder ball 5 is formed into a solder layer in the shape of a downward truncated cone, as shown in FIG. 5A. Thus, the solder ball 5 of the upper substrate 20 and the connection pad 4 on the circuit substrate 2 are connected through the solder layer 5B in the shape of the truncated cone whose diameter is reduced downwards and enlarged upwards.

Figure 5B:
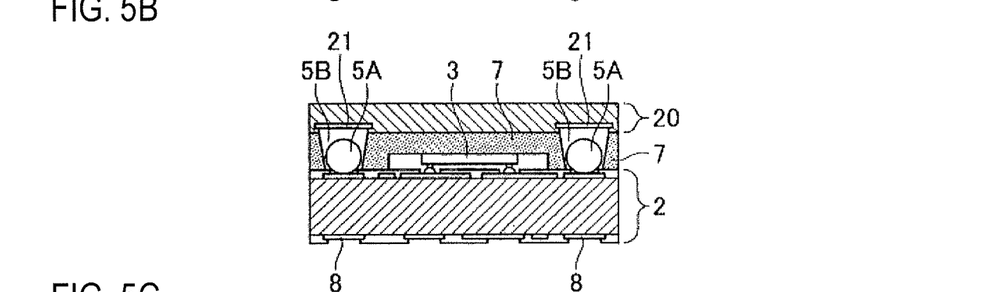

Subsequently, as shown in FIG. 5B, an epoxy-based resin is filled between the mounting surface of the circuit substrate 2 and the upper substrate 20 by a so-called "transfer molding process", thereby to form the molding resin layer 7.

Figure 5C:
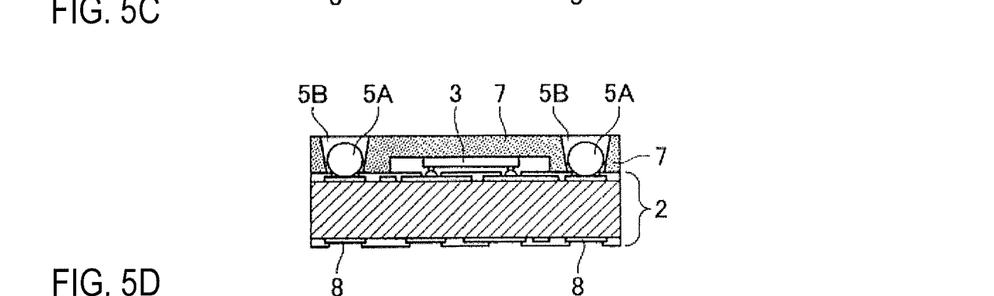

Thereafter, a polishing process is performed from the side of the upper substrate 20, thereby to selectively remove only the upper substrate 20 (FIG. 5C).

In this state, the molding resin layer 7 is formed with the vias 6 each being in the shape of a truncated cone, along the truncated-cone-shaped solder layers 5B.

Figure 5D:
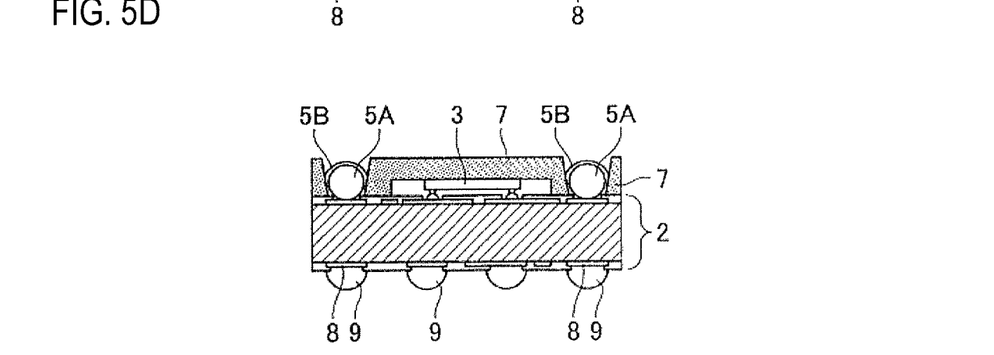

Further, a reflow process is performed, whereby the solder balls 9 are mounted on the respective connection terminals 8 formed on the lower surface of the circuit substrate 2 (FIG. 5D).

On this occasion, the truncated-cone-shaped solder layer 5B stated above is formed into a spherical solder layer along the surface of the copper core 5A on the basis of the surface tension of this solder layer 5B, and part of such a spherical solder layer 5B is exposed from the molding resin layer 7 through the via 6.

Thus, according to the second embodiment, the same semiconductor device 1 as the semiconductor device of the first embodiment is manufactured. In the semiconductor device 1, that upper end part of the solder layer 5B which is exposed from each via 6 of the molding resin layer 7 serves as a mounting terminal for connecting this semiconductor device with another circuit substrate or the like.

Also in the semiconductor device 1 and the manufacturing method thereof according to the second embodiment, the same advantages as in the semiconductor device and the manufacturing method thereof according to the first embodiment can be attained.

Next, a semiconductor device and the manufacturing method thereof according to a third embodiment will be described in conjunction with FIGS. 6A and 6B.

Here, the semiconductor device and the manufacturing method thereof according to the third embodiment are basically the same as the semiconductor device 1 and the manufacturing method thereof according to the first embodiment, respectively, and they are merely different in the point that a solder ball in which a low-melting solder layer is formed on the surface of a spherical lead-free solder core is used as each of the solder balls which are mounted on the solder-ball-mounting portions 11 of the support plate 10. In the ensuing description, accordingly, note shall be taken of only configurations peculiar to the third embodiment as come from the point of the configurational difference of the solder balls.

Figure 6A:
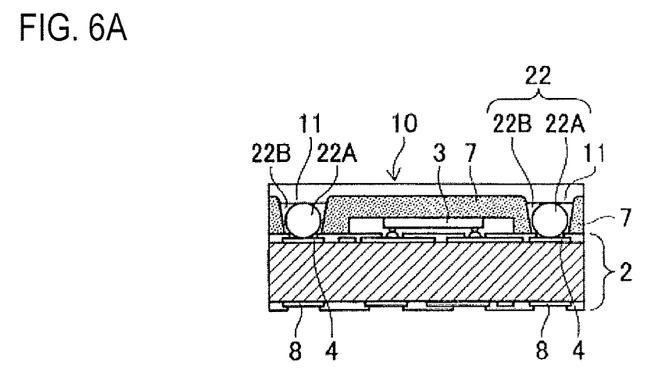
FIGS. 6A and 6B are views showing a method of manufacturing a semiconductor device according to a third embodiment.
Figure 6B:
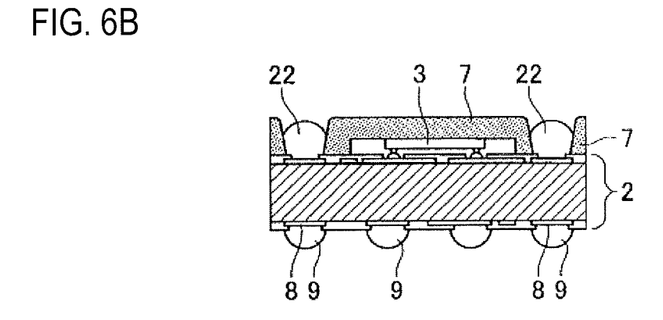

In order to manufacture the semiconductor device according to the third embodiment, as shown in FIG. 6A, the solder ball formed with the low-melting solder layer 22B on the surface of the spherical lead-free solder core 22A is mounted as each solder ball 22 on the support plate 10 made of copper. The respective solder balls 22 of the support plate 10 are opposed to and abutted with the corresponding connection pads 4 of the circuit substrate 2 on which the semiconductor chip 3 is mounted. More specifically, the support plate 10 is attached to a head (not shown) having a built-in heater and the circuit substrate 2 is attached to a stage (not shown) having a built-in heater. The head is opposed to the stage so that the respective solder balls 22 are opposed to and abutted with the corresponding connection pads 4. In this state, the support plate 10 and the circuit substrate 2 are heated by the built-in heaters, respectively, and thus, as shown in FIG. 6A, the respective solder balls 22 of the support plate 10 are connected to the corresponding connection pads 4 of the circuit substrate 2.

On this occasion, as in the case of the first embodiment, a difference is provided between the diameter of the solder-ball mounting portion 11 of the support plate 10 and the diameter of the connection pad 4 of the circuit substrate 2. Owing to such a difference of the diameters, when the solder ball 22 of the support plate 10 is connected to the connection pad 4 of the circuit substrate 2 by heating with the heaters, the low-melting solder layer 22B formed on the surface of the lead-free solder core 22A is formed into a solder layer in the shape of a downward truncated cone, as shown in FIG. 6A. Thus, the solder ball 22 of the support plate 10 and the connection pad 4 on the circuit substrate 2 are connected through the low-melting solder layer 22B in the shape of the truncated cone whose diameter is reduced downwards and enlarged upwards.

Thereafter, as in the case of the first embodiment, an epoxy-based resin is filled between the mounting surface of the circuit substrate 2 and the support plate 10 by a so-called "transfer molding process", thereby to form the molding resin layer 7. Thereafter, only the support plate 10 is selectively removed by an etching process. Further, a reflow process is performed, whereby the solder balls 9 are mounted on the respective connection terminals 8 formed on the lower surface of the circuit substrate 2 (FIG. 6B).

On this occasion, the truncated-cone-shaped low-melting solder layer 22B and the lead-free solder core 22A as stated above are molten and united with each other. The solder layer 22B molten and united with the lead-free solder core 22A in this manner is formed into a spherical shape on the basis of its surface tension, and part of such a spherical solder layer is exposed from the molding resin layer 7 through the via 6.

Thus, the semiconductor device 1 according to the third embodiment is manufactured, and that upper end part of the solder layer which is exposed from each via 6 of the molding resin layer 7 serves as a mounting terminal for connecting this semiconductor device with another circuit substrate or the like.

The same advantages as those of the semiconductor device and the manufacturing method thereof according to the first embodiment can be attained also by the semiconductor device 1 and the manufacturing method thereof according to the third embodiment.

Incidentally, it is a matter of course that the present invention is not limited to the respective embodiments, but that it is capable of various improvements and modifications within a scope not departing from the purport thereof.

By way of example, in the first and second embodiments, the solder ball in which the solder layer 5B is formed on the surface of the copper core 5A is used, as the solder ball 5 which is mounted on the solder-ball-mounting portion 11 of the support plate 10 or on the solder-ball-mounting pad 21 of the upper substrate 20. Besides, in the third embodiment, the solder ball in which the low-melting solder layer 22B is formed on the surface of the lead-free solder core 22A is used as the solder ball 22 which is mounted on the solder-ball mounting portion 11 of the support plate 10, but it is also possible to use an ordinary solder ball.

In this case, the solder balls formed on the support plate 10 or the upper substrate 20 might fail to reach the circuit substrate 2 of the lower side. In manufacturing the semiconductor device 1, therefore, the solder balls are first connected to and mounted on the respective connection pads 4 of the circuit substrate 2 beforehand. Thereafter, the support plate 10 having the solder-ball-mounting portions 11 is placed on the circuit substrate 2, and the solder balls are connected to the solder-ball-mounting portions 11 of the support plate 10 by heating. On this occasion, the solder layer formed from each of the solder balls is formed into the shape of the truncated cone on the basis of the difference between the diameter of the solder-ball-mounting portion 11 of the support plate 10 and the diameter of the connection pad 4 of the circuit substrate 2.

Thereafter, processes similar to those in the case of the first to third embodiments are performed.

While certain embodiments have been described, these embodiments have been presented by way of example only, and are not intended to limit the scope of the invention. Indeed, the novel device and method described herein may be embodied in a variety of other forms; furthermore, various omissions, substitutions and changes in the form of the device and method, described herein may be made without departing from the spirit of the invention. The accompanying claims and their equivalents are intended to cover such forms or modifications as would fall within the scope and spirit of the invention

What is claimed is:

1. A semiconductor device comprising:
   a semiconductor chip;
   a circuit substrate having a mounting surface on which the semiconductor chip is mounted and at least one connection pad formed on the mounting surface;
   a resin layer formed on the mounting surface of the circuit substrate, the resin layer having at least one truncated-cone-shaped via; and
   at least one mounting terminal disposed on the connection pad and connected to the connection pad, the mounting terminal having a spherical solder layer, a part of the spherical solder layer exposed through the truncated-cone-shaped via of the resin layer,
   wherein the mounting terminal is formed in such a way that the circuit substrate is connected to a support plate having at least one mounting portion with a diameter larger than a diameter of the connection pad, through a truncated-cone-shaped solder layer which is formed from at least one solder ball on the basis of a difference between the diameter of the mounting portion and the diameter of the connection pad, that the resin layer is formed between the mounting surface of the circuit substrate and the support plate and the support plate is subsequently removed, whereby the truncated-cone-shaped via is formed in the resin layer along the truncated-cone-shaped solder layer, and that a reflow process is thereafter performed, whereby the truncated-cone-shaped solder layer is formed into the spherical solder layer within the truncated-cone-shaped via.

2. The semiconductor device as defined in claim 1, wherein the mounting portion of the support plate has a protruding shape.

3. The semiconductor device as defined in claim 1, wherein the support plate is a substrate and the mounting portion is a mounting pad formed on the substrate.

4. The semiconductor device as defined in claim 1, wherein the solder ball has a spherical copper core and the solder layer formed on a surface of the spherical copper core.

5. The semiconductor device as defined in claim 1, wherein the solder ball has a spherical lead-free solder core and the solder layer having a low-melting property formed on a surface of the spherical lead-free solder core.

6. The semiconductor device as defined in claim 1, wherein the support plate is removed through an etching process.

7. The semiconductor device as defined in claim 1, wherein the support plate is removed through a polishing process.

8. The semiconductor device as defined in claim 1, wherein before connecting the circuit substrate to the support plate, the solder ball is mounted on the mounting portion.

9. The semiconductor device as defined in claim 1, wherein before connecting the circuit substrate to the support plate, the solder ball is mounted on the connection pad.

10. The semiconductor device as defined in claim 1, wherein before connecting the circuit substrate to the support plate, the solder ball is heated so that the solder layer of the solder ball is formed into the truncated-cone-shape on the basis of the difference between the diameters of the mounting portion and the connection pad.

* * * * *